United States Patent
Zhu et al.

(10) Patent No.: US 8,350,253 B1
(45) Date of Patent: Jan. 8, 2013

(54) INTEGRATED CIRCUIT WITH STRESS INSERTS

(75) Inventors: Bei Zhu, Los Gatos, CA (US); Hong-Tze Pan, Cupertino, CA (US); Bang-Thu Nguyen, Santa Clara, CA (US); Qi Lin, Cupertino, CA (US); Zhiyuan Wu, San Jose, CA (US); Ping-Chin Yeh, San Jose, CA (US); Jae-Gyung Ahn, Pleasanton, CA (US); Yun Wu, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 211 days.

(21) Appl. No.: 12/697,027

(22) Filed: Jan. 29, 2010

(51) Int. Cl.
*H01L 29/06* (2006.01)
(52) U.S. Cl. .................. 257/19; 257/E29.193
(58) Field of Classification Search .......... 257/19, 257/E29.193
See application file for complete search history.

(56) References Cited

U.S. PATENT DOCUMENTS

| | | | |
|---|---|---|---|
| 4,486,518 A * | 12/1984 | Kesselman et al. | 430/5 |
| 7,514,328 B2 | 4/2009 | Rao | |
| 7,528,072 B2 | 5/2009 | Rotondaro et al. | |
| 7,612,364 B2 * | 11/2009 | Chuang et al. | 257/19 |
| 2007/0252230 A1 * | 11/2007 | Zhu et al. | 257/499 |
| 2009/0166755 A1 | 7/2009 | Chakravarthi et al. | |
| 2009/0170270 A1 | 7/2009 | Chakravarthi et al. | |
| 2010/0022061 A1 * | 1/2010 | Wu et al. | 438/301 |
| 2010/0200897 A1 * | 8/2010 | Heringa et al. | 257/288 |
| 2011/0115000 A1 * | 5/2011 | Yang | 257/288 |

* cited by examiner

*Primary Examiner* — Julio J Maldonado
*Assistant Examiner* — Hajar Kolahdouzan
(74) *Attorney, Agent, or Firm* — Scott Hewett; Gerald Chan (57) ABSTRACT

An integrated circuit ("IC") fabricated on a semiconductor substrate has an active gate structure formed over a channel region in the semiconductor substrate. A dummy gate structure is formed on a dielectric isolation structure. The dummy gate structure and the active gate structure have the same width. A sidewall spacer on the dummy gate structure overlies a semiconductor portion between a strain-inducing insert and the dielectric isolation structure.

13 Claims, 8 Drawing Sheets

INTEGRATED CIRCUIT WITH STRESS INSERTS

FIELD OF THE INVENTION

The present invention relates generally to semiconductor devices, and more particularly to MOS transistors having enhanced carrier mobility due to channel strain from tensile or compressive inserts.

BACKGROUND OF THE INVENTION

ICs use various sorts of devices to create logic circuits. Many types of ICs use complementary metal-oxide-semiconductor ("CMOS") logic circuits. CMOS logic circuits use CMOS cells that have a first-conductivity-type metal-oxide-semiconductor ("MOS") transistor (e.g. a p-type MOS ("PMOS") transistor) paired with a second-conductivity-type MOS transistor (e.g. an n-type MOS ("NMOS") transistor). CMOS cells can hold a logic state while drawing only very small amounts of current.

It is generally desirable that MOS transistors provide good conductivity between the source and the drain of the MOS transistor when operating voltage is applied to the gate of the MOS transistor. In other words, it is desirable that current flows through the channel between the source and the drain when the MOS transistor is turned on.

The amount of current flowing through the channel of an MOS transistor is proportional to the mobility of charge carriers in the channel. Increasing the mobility of the charge carriers increases the amount of current that flows at a given gate voltage. Higher current flow through the channel allows the MOS transistor to operate faster. One of the ways to increase carrier mobility in the channel of a MOS transistor is to produce strain in the channel.

There are several ways to create strain in the channel region. One approach is to form stressed materials, such as epitaxially grown SiGe, in the source and drain regions of a PMOS transistor. Unfortunately, many conventional processes form embedded SiGe that abuts oxide used for isolation (e.g., shallow-trench isolation ("STI")) between MOS devices. However, epitaxial SiGe does not grow on the oxide, so the SiGe inserts grow from the bottom of the insert pockets (recesses) formed in the semiconductor wafer (e.g., crystalline silicon) and form facets that grow into the oxide. The oxide is relatively soft, which results in less SiGe-induced stress in the channel of the PMOS device at the opposite end of the SiGe insert.

Techniques have been developed to form SiGe inserts so that they are within recesses in the semiconductor wafer, without the SiGe adjoining the isolation oxide. Disposable gate structures are formed on the isolation oxide when the active (MOS FET) gates are formed. Sidewall (offset) spacers formed on the active gate to self-align drain/source areas of the FET to the active gate are also formed on the disposable gate structures. When the recesses (pockets) for the growing the epitaxial SiGe are formed, the edge of the recess is offset from the isolation oxide by the thickness of the sidewall spacers on the disposable gate structure.

Unfortunately, the optimum offset from the isolation oxide may not be equal to the optimum gate electrode-drain/source offset, particularly at fine device geometries. Similarly, the disposable gate structures extend across the isolation oxide for the offset spacers to provide the desired semiconductor for the SiGe pockets. The active gate structures are frequently a different width than the isolation oxide. In very geometry FETs, the active gate may be much narrower (as measured along the channel length of the FET) than the isolation oxide. Disposable gate structures provide beneficial mechanical support when performing chemical-mechanical polishing or other wafer processing; however, such benefits are degraded when the disposable gate structures are much wider than the active gate structures.

Techniques for enhancing carrier mobility in PMOS FETs using SiGe inserts that avoid the disadvantages of the prior art are desirable.

SUMMARY OF THE INVENTION

An integrated circuit on a semiconductor substrate has an active gate structure with a gate structure width formed over a channel region in the semiconductor substrate. A first sidewall spacer disposed on a first sidewall of the active gate structure has a first sidewall spacer width. A dummy gate structure having the gate structure width is formed on a dielectric isolation structure. A second sidewall spacer disposed on a second sidewall of the dummy gate structure has a second sidewall spacer width. A strain-inducing insert formed in the semiconductor substrate extends from the first sidewall spacer to the second sidewall spacer. A semiconductor portion remains between the strain-inducing insert and the dielectric isolation structure.

An embodiment for fabricating an IC on a semiconductor wafer comprises forming a plurality of gate structures including an active gate structure formed over a channel region of the semiconductor wafer and a dummy gate structure formed on an isolation oxide structure. Each of the active gate structure and the dummy gate structure has the same gate structure width (i.e., same designed width, as minor variations arise from processing). A first sidewall spacer is formed on the active gate structure and a second sidewall spacer is formed on the dummy gate structure. The second sidewall spacer overlaps a boundary between a semiconductor portion of the semiconductor wafer and the isolation oxide structure. A recess is formed in the semiconductor wafer extending from the first sidewall spacer to the second sidewall spacer; and a strain-inducing insert is formed in the in the recess. In a particular embodiment, SiGe is epitaxially grown in the recess to form the strain inducing insert. In an alternative embodiment, SiC is epitaxially grown in the recess to form the strain inducing insert.

DETAILED DESCRIPTION OF THE DRAWINGS

Figure 1:
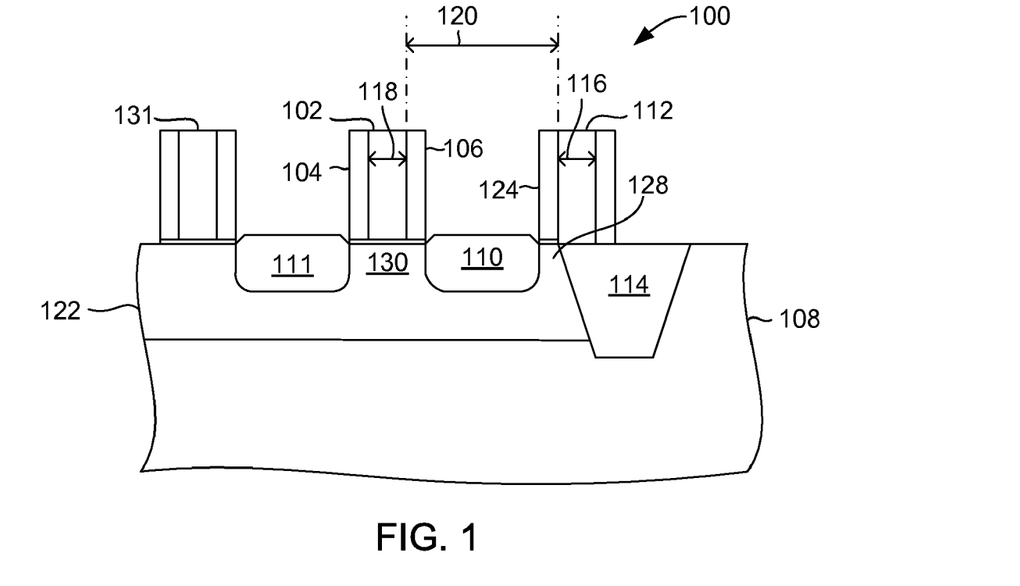
FIG. 1 is a simplified cross section of a portion of a partially fabricated IC wafer according to an embodiment.

FIG. 1 is a simplified cross section of a portion of a partially fabricated IC wafer 100 according to an embodiment. An active gate structure 102 with sidewall spacers 104, 106 is formed on a semiconductor substrate 108 between strain-inducing inserts 110, 111, which are formed in the source and drain regions of the eventual FET. The strain-inducing inserts 110, 111 strain the channel region 130, which enhances carrier mobility and FET operation. In one embodiment, the eventual FET is a PMOS FET and the strain-inducing inserts are formed from epitaxially grown SiGe. In an alternative embodiment, the eventual FET will be an NMOS FET and the inserts are SiC or other material. Those of skill in the art appreciate that whether an insert operates as a source or a drain depends on how a FET is connected. Generally, when a FET is operated, a voltage applied to the gate controls current flow between the drain and source through the channel region 130, which is separated from the active gate structure 102 by a gate dielectric layer.

A "dummy gate structure" 112 is formed on shallow trench isolation ("STI") 114 or other isolation dielectric. The STI 114 is dielectric material, such as silicon oxide, that provides electrical isolation between regions of the IC. The dummy gate structure is called a "dummy" gate because it is not electrically connected and does not operate as a control terminal of an FET. Dummy gates are used in wafer fabrication to provide a more uniform surface during a subsequent chemical-mechanical polishing (CMP) process. Dummy gate structures are useful to avoid underpolishing or overpolishing areas of the wafer. While relatively large pitch ICs (i.e., where the distance between FETs is relatively large), the width of the dummy gate structures relative to the active gates is often not critical, allowing dummy gate structures have different widths than the active gate structures. The dummy gate also helps achieve better gate critical dimension (CD) uniformity in the lithographic process if the dummy gate is placed at the same spacing as the active gates.

In ICs with fine pitch, generally, less than 90 nanometer node technology and more particularly in node technologies less than 45 nanometers, it is desirable for the dummy gate structures to have the same design width as the active gate structures to improve gate CD control and uniformity through the lithography/etching/CMP processes. The width 116 of the dummy gate structure 112 is designed to be the same as the width 118 of the active gate structure 104. As used herein, the gate structure width 118 corresponds to channel length in a FET. The term "gate structure width" is used for purposes of convenient discussion.

A parameter of importance in FET design and fabrication is the distance from the lateral edge of an active gate structure to the distal edge of the diffusion area. This dimension is commonly referred to as "SA", and is shown by double-ended arrow 120. In a 45 nm node technology, a drive current degradation of greater than 10% has been observed in edging PMOS FETs that have a small SA dimension. An edging FET is basically the last FET on the end of a diffusion area. Often, a relatively long diffusion area has several active gate structures overlying the diffusion area. Edging FETs occur at each end of the shared diffusion area. In comparison, the FET associated with active gate structure 131 is not an edging FET. The diffusion area extends to the next FET on one side of the edging FET gate structure, and to the STI on the opposite side of the edging FET gate. Embodiments of the invention are particularly desirable when used with edging FETs of a common diffusion area. Such techniques are often used in SRAM cells, for example, where several of one type of FET (i.e., NMOS FETs or PMOS FETs) share a common diffusion area.

In a particular embodiment, the distance between the active gate structure 102 and the dummy gate structure 112 is designed to be the same distance as SA 120, namely, the distance between the lateral edge of the active gate structure 102 and the edge of the diffusion area 122 (at the surface of the wafer 108). When the active-dummy gate spacing is the same as SA, the sidewall spacer 124 on the dummy gate structure 112 masks the underlying semiconductor from being etched when the pocket (recess) for the strain-inducing insert 110 is formed. This leaves a portion of semiconductor 128 for the strain-inducing insert to nucleate on during growth of the insert material, and provides a harder structure for the strain-inducing insert 110 to push against (compared to the relatively soft, amorphous STI oxide), thereby increasing strain, and improving carrier mobility, in the channel region 130 of the resultant FET. In a particular embodiment, the dummy gate sidewall spacer 124 results in about 15 nm of silicon material remaining between the strain-inducing insert 110 and the STI 114. In this embodiment, the sidewall spacer 124 on the dummy gate structure 112 has the same thickness as the sidewall spacers 104, 106 on the active gate structure 102. As used herein, "the same" means it is intended to be the same according to the design. Minor dimensional variations will arise due to process variations.

Figure 2:
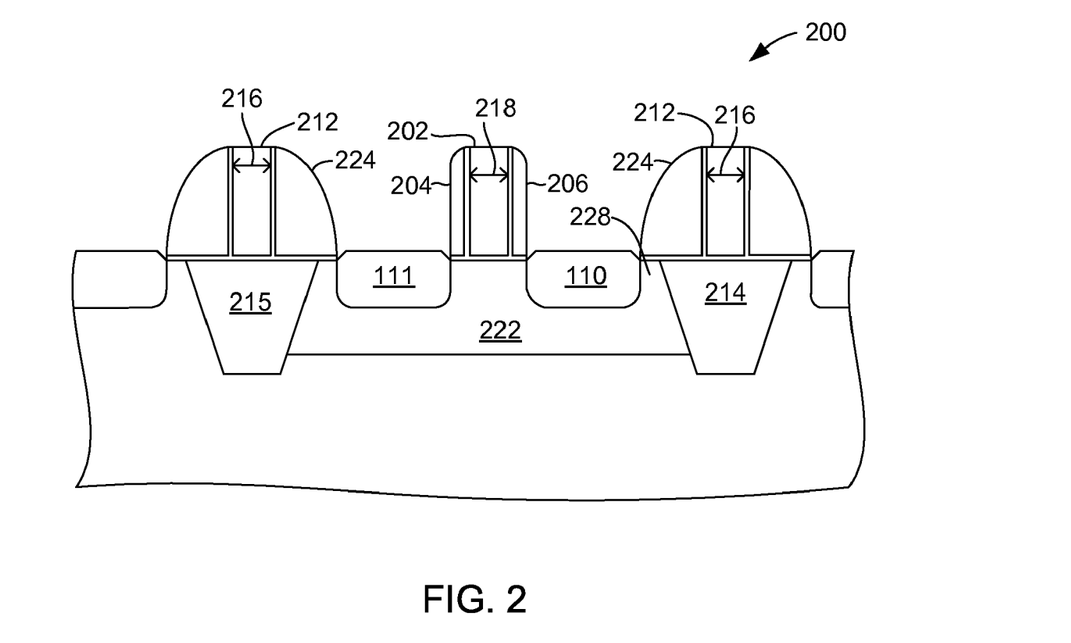
FIG. 2 is a simplified cross section of a portion of a partially fabricated IC wafer according to another embodiment.

FIG. 2 is a simplified cross section of a portion of a partially fabricated IC wafer 200 according to another embodiment. An active gate structure 202 has sidewall spacers 204, 206 that are substantially thinner than the sidewall spacers 224 on dummy gate structures 212. The gate structure width 218 of the active gate structure 202 is substantially the same as the width 216 of the dummy gate structures 212. Providing thicker sidewall spacers on the dummy gate structures allows the dummy gate structures 212 to be placed away from the edge of the diffusion region 222 (compare, FIG. 1, ref. num 120), while still providing a semiconductor portion 228 between the strain-inducing inserts 110, 111 and the STIs 214, 215. The active gate structure 202 will eventually become a gate electrode for a FET in the IC, and is isolated from other FETs by STIs 214, 215, such as in a CMOS portion of the IC. Alternatively, techniques in accordance with FIG. 2 are used for edging FETs.

In a particular embodiment, the sidewall spacer 224 is formed from a layer of silicon nitride that overlies a thin silicon oxide layer commonly known as a liner layer. In FIG. 2, the thickness of the liner layer is exaggerated for purposes of illustration. The sidewall spacers 204, 206 on the active gate structure 202 are also formed from the silicon nitride layer, but are thinned to a thickness appropriate for the active gate structure 202 (see generally, FIGS. 4A-4E for an exemplary fabrication sequence). In a more particular embodiment, a sidewall spacer layer of silicon nitride about 30 nm thick is processed to form a dummy sidewall spacer 224 sufficient to extend over a portion of the STI oxide and the semiconductor portion 228.

Figure 3:
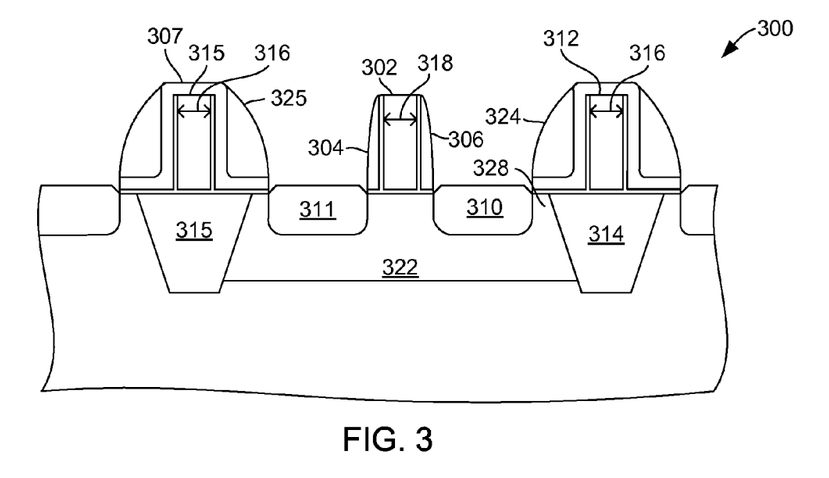
FIG. 3 is a simplified cross section of a portion of a partially fabricated IC wafer according to another embodiment.

FIG. 3 is a simplified cross section of a portion of a partially fabricated IC wafer 300 according to another embodiment. An active gate structure 302 has sidewall spacers 304, 306 thinner than the sidewall spacers 324, 325 on the dummy gate structures 312, 313. The width 318 of the active gate structure 302 is substantially the same as the width 316 of the dummy gate structure 312.

Figure 5A:
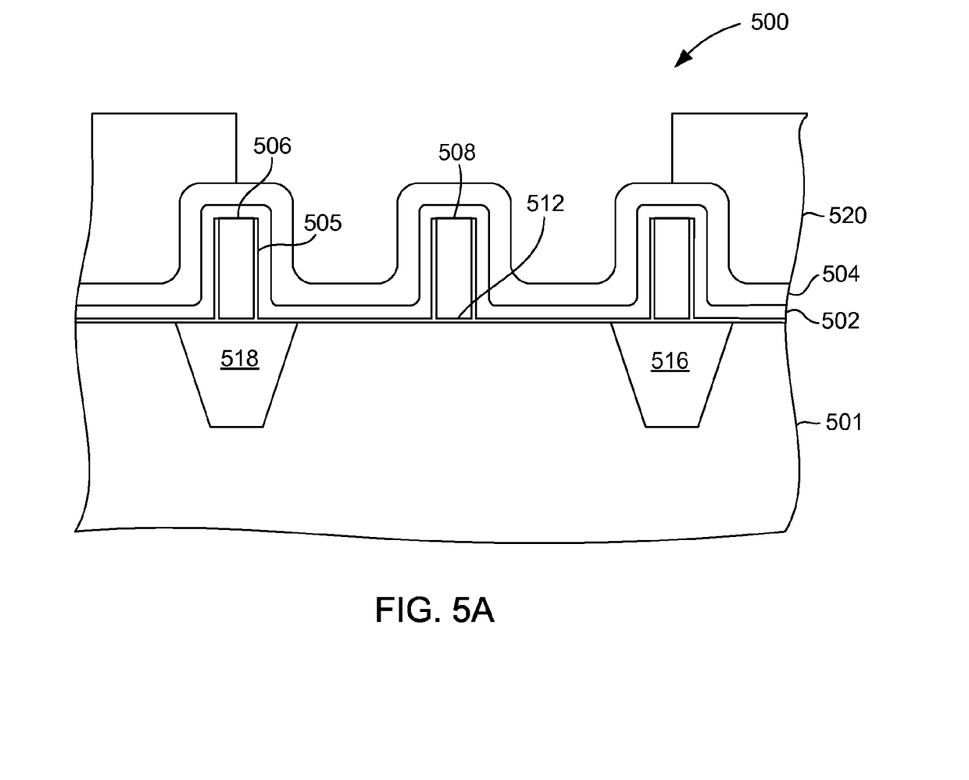
FIG. 5A is a simplified cross section of a portion of a partially fabricated IC wafer illustrating a processing sequence according to an alternative embodiment.

In a particular embodiment, the sidewall spacers 304, 306 are formed from a silicon nitride layer 307, and the sidewall spacers 324, 325 are formed from the silicon nitride layer 307 in combination with a silicon oxide layer (see, e.g., FIG. 5A, ref. nums. 502, 504). The silicon oxide layer is stripped from the active gate structure before forming the recesses for the strain-inducing inserts 310, 311 (see generally, FIGS. 5A-5D for an exemplary fabrication sequence). Providing thicker sidewall spacers on the dummy gate structures allows the dummy gate structures 312 to be placed away from the edge of the diffusion region 322 (compare, FIG. 1, ref. num 120), while still providing a semiconductor portion 328 between the strain-inducing inserts 310, 311 and the STIs 314, 315. In a particular embodiment, the combined thickness of both sidewall spacer layers is about 30 nm, which form a composite dummy sidewall spacer 324 sufficient to extend over a portion of the STI oxide and the semiconductor portion 328. In some embodiments, the inner sidewall spacer layer 307 is relatively thick, and the active sidewall spacers 304, 306 are formed by thinning the inner sidewall spacer layer on the active gate structure 302. In alternative embodiments, the inner sidewall spacer layer is relatively thin so that a separate thinning process is not required.

Figure 4A:
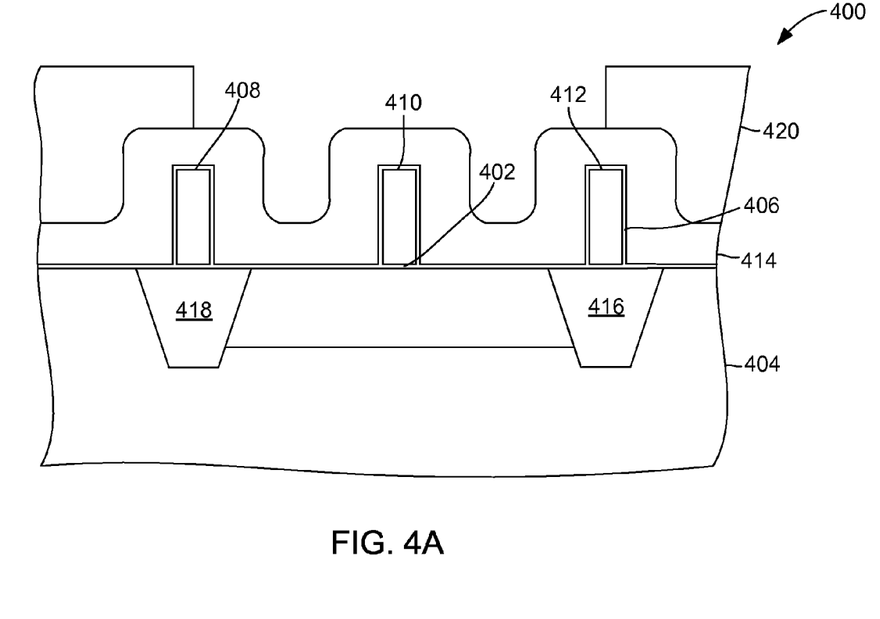
FIG. 4A is a simplified cross section of a portion of a partially fabricated IC wafer illustrating a processing sequence according to an embodiment.

FIG. 4A is a simplified cross section of a portion of a partially fabricated IC wafer 400 illustrating a processing sequence according to an embodiment. A thin dielectric layer 402 is formed on a semiconductor substrate 404, such as a silicon wafer, and will provide a gate dielectric layer in an FET on the finished IC. An oxide layer 406 is formed on polysilicon gate structures ("poly gates") 408, 410 412 to serve as offset spacers as well as to provide an etch stop layer. In the finished IC, poly gate 410 will be an active gate and poly gates 408, 412 will be dummy gate structures. The dummy gate structures 408, 412 are formed on isolation oxide 416, 418. A sidewall spacer layer 414, which in a particular embodiment is a layer of silicon nitride about 0.035 microns thick, has been deposited over the poly gates 408, 410, 412. A layer of patterned photoresist 420 covers portions of the IC wafer 400. Photolithography techniques are well known in the art of IC wafer fabrication; therefore, a detailed description of such techniques is omitted.

Figure 4B:
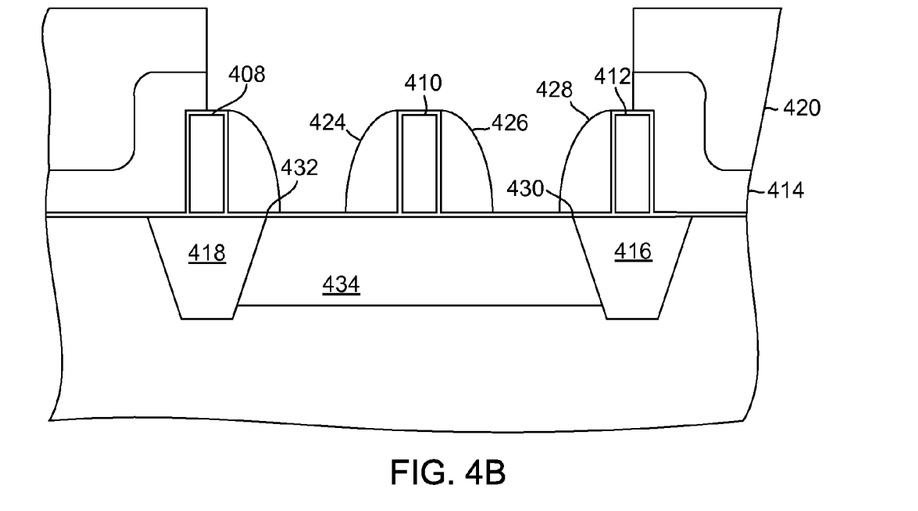
FIG. 4B shows the IC wafer of FIG. 4A at a subsequent processing step.

FIG. 4B shows the IC wafer of FIG. 4A at a subsequent processing step. An anisotropic etching technique, such as a plasma dry nitride etch technique, has been used to form sidewall spacers 422, 424, 426, 428 on the poly gates 408, 410, 412. The anisotropic etch preferentially removes material from the sidewall spacers (e.g., silicon nitride). In an alternative embodiment, sidewall spacers are also formed on the lateral edges of the dummy poly gates 408, 412 that are distal from the active poly gate 410. The sidewall spacers 422, 428 cover the boundaries 430, 432 between the active region 434 and the isolation oxide 416, 418, and extend a selected distance over the semiconductor of the active region 434. The selected distance is controllable according to the thickness of the spacer layer 414 and the sidewall etch process. In a particular embodiment, the sidewall spacer 428 on the dummy poly gate structure 412 extends about 15 nm from the edge of the isolation oxide 416.

Figure 4C:
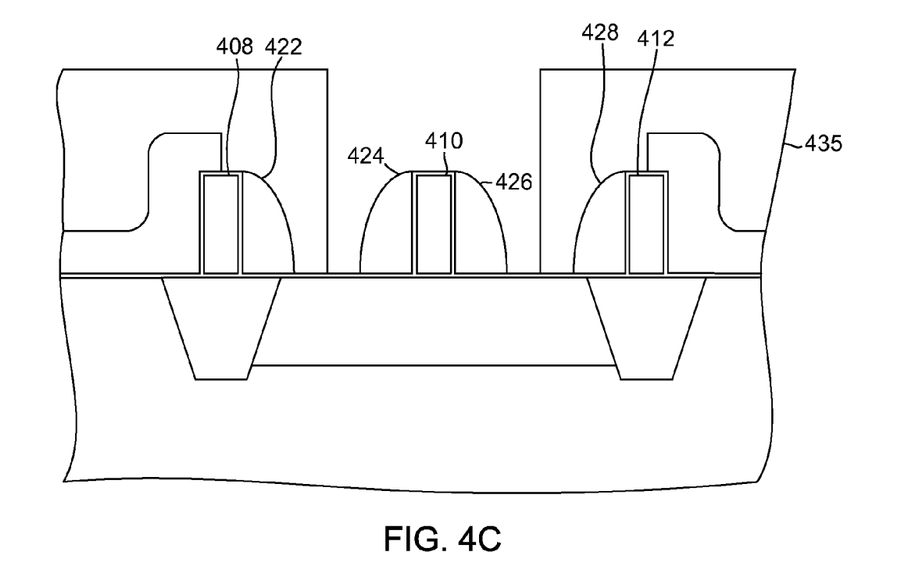
FIG. 4C shows the IC wafer of FIG. 4B at a subsequent processing step.

FIG. 4C shows the IC wafer of FIG. 4B at a subsequent processing step. A second layer of patterned photoresist 435 covers the sidewall spacers 422, 428 on the dummy poly gates 408, 412 while leaving the sidewall spacers 424, 426 on the active poly gate 410 exposed.

Figure 4D:
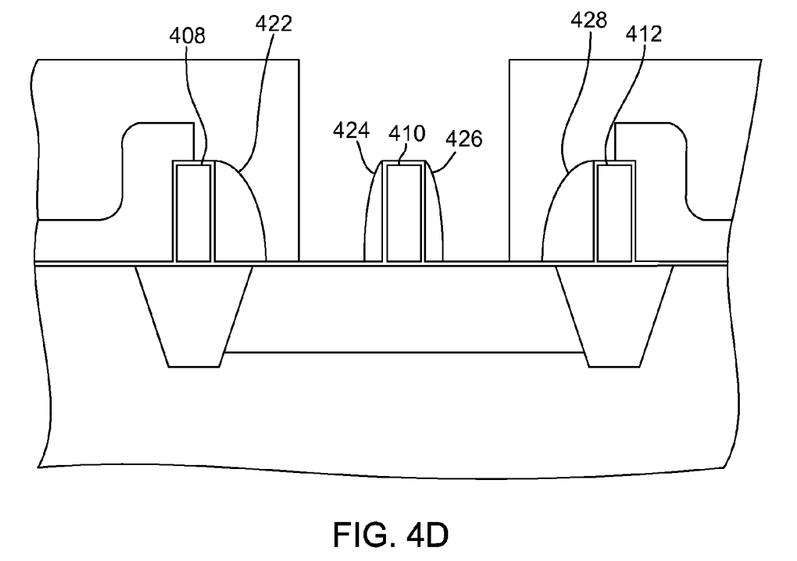
FIG. 4D shows the IC wafer of FIG. 4C at a subsequent processing step.

FIG. 4D shows the IC wafer of FIG. 4C at a subsequent processing step. An anisotropic etch technique has been used to thin the sidewall spacers 424, 426 on the active poly gate 410, while the thickness of the sidewall spacers 420, 428 on the dummy poly gates 408, 412 remains unchanged.

Figure 4E:
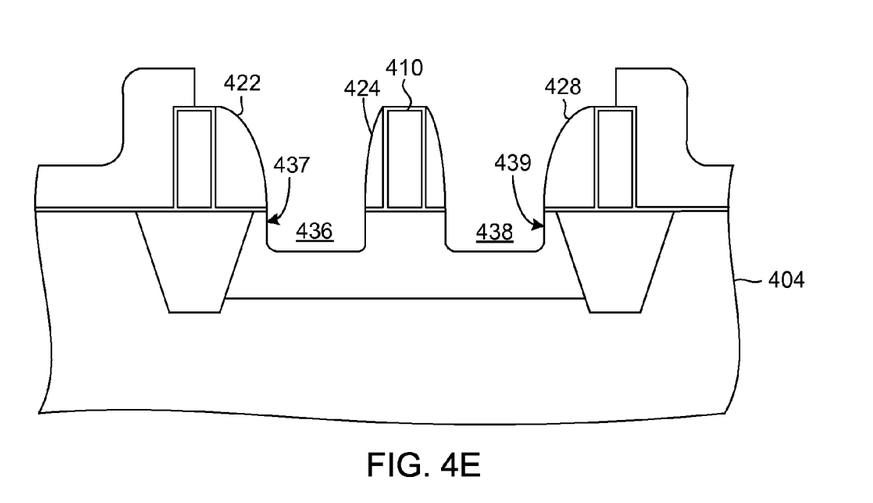
FIG. 4E shows the IC wafer of FIG. 4D at a subsequent processing step.

FIG. 4E shows the IC wafer of FIG. 4D at a subsequent processing step. A different anisotropic etch technique is used to form recesses (pockets) 436, 438 in the semiconductor material 404. The recesses 436, 438 have semiconductor walls 437, 439 that facilitate nucleation and growth of the insert material used for strain-inducing inserts (see, e.g., FIG. 2, ref. nums. 110, 111).

FIG. 5A is a simplified cross section of a portion of a partially fabricated IC wafer 500 illustrating a processing sequence according to an alternative embodiment. Two sidewall spacer layers 502, 504 have been formed on poly gate structures 506, 508, 510. In a particular embodiment, the upper layer 504 is an oxide layer, such as a layer of deposited silicon oxide about 30 nm thick, and the lower layer is a nitride layer, such as a layer of deposited silicon nitride about 15 thick.

A thin dielectric layer 512 is formed on a semiconductor substrate 501, such as a silicon wafer, and will provide a gate dielectric layer in an FET on the finished IC. An oxide layer 505 is formed on the polysilicon gate structures ("poly gates") 506, 508, 510 to serve as offset spacers. Poly gate structure 508 will be an active gate of an FET in the finished IC device, and poly gates 506, 510 are dummy gates. The dummy gate structures 506, 510 are formed on isolation oxide 516, 518. A layer of patterned photoresist 520 covers portions of the IC wafer 500.

Figure 5B:
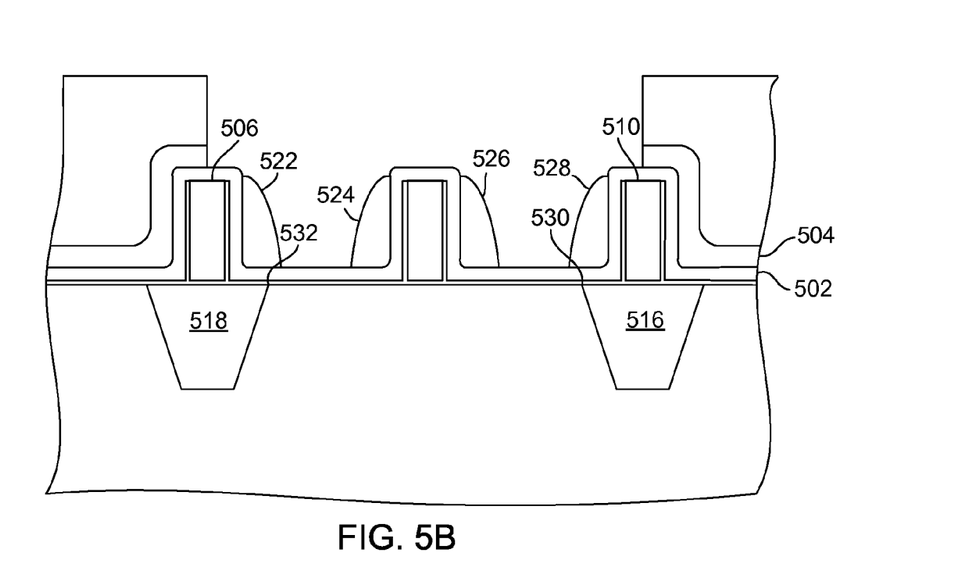
FIG. 5B shows the IC wafer of FIG. 5A at a subsequent processing step.

FIG. 5B shows the IC wafer of FIG. 5A at a subsequent processing step. An anisotropic etch technique (e.g., a plasma etch that preferentially removes silicon oxide while not removing silicon nitride) has been used to etch the material of the upper (or outer) sidewall spacer layer 504, while leaving the material of the lower (or inner) sidewall spacer layer 502 relatively intact. The etch is performed to produce outer sidewall spacers 522, 524, 526, 528. The outer sidewall spacers 522, 528 on the dummy gate structures 506, 510 overlap the boundaries 530, 532 between the semiconductor material 534 (e.g., single-crystal silicon) and the isolation oxide 516, 518.

Figure 5C:
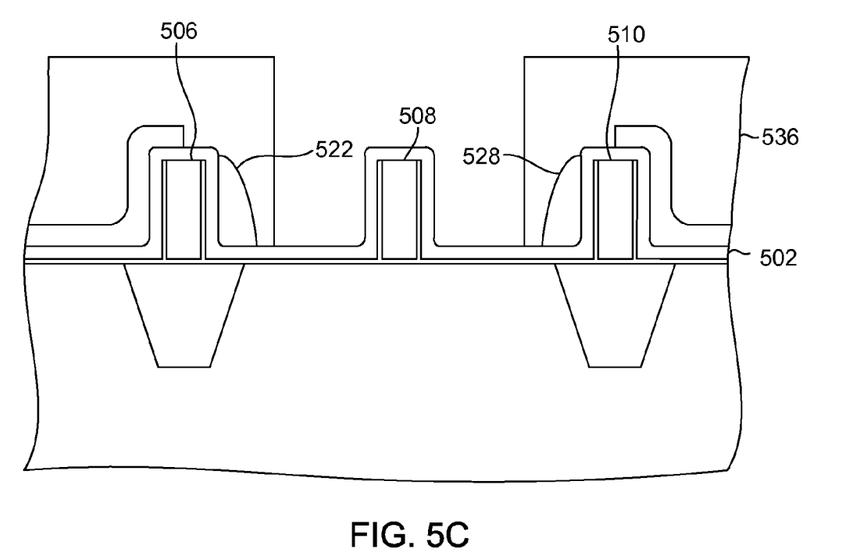
FIG. 5C shows the IC wafer of FIG. 5B at a subsequent processing step.

FIG. 5C shows the IC wafer of FIG. 5B at a subsequent processing step. A second patterned layer of photoresist 536 covers the outer sidewall spacers 522, 528 on the dummy gate structures 506, 510, and an etch technique, such as a wet etch, isotropic dry etch, or anisotropic dry etch, is used to remove the outer sidewall spacers from the active gate structure 508 (compare, FIG. 5B, ref. nums. 524, 526). The lower sidewall spacer layer 502 remains on the active gate structure 508.

Figure 5D:
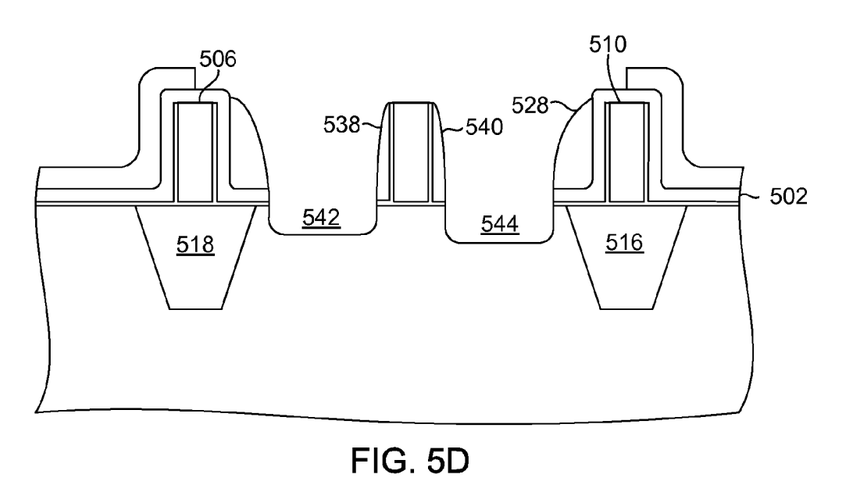
FIG. 5D shows the IC wafer of FIG. 5C at a subsequent processing step.

FIG. 5D shows the IC wafer of FIG. 5C at a subsequent processing step. A first etch process is used to form active sidewall spacers 538, 540 from the material of the lower sidewall spacer layer 502, and a second etch process is used to form recesses 542, 544 for subsequent strain-inducing inserts (see, e.g., FIG. 3, ref. nums. 310, 311). In an alternative embodiment, a single etch process is used to both form the active sidewall spacers and the recesses. The recesses are formed in the semiconductor material of the semiconductor substrate 501 so that the subsequent strain-inducing inserts do not form facets that contact the isolation oxide 516, 518. The active sidewall spacers 538, 540 are substantially thinner than the sidewall spacers on the dummy gate structures 506, 510. In a particular embodiment, the active sidewall spacers are about 30 nm thick, while the dummy sidewall spacers are about 45 nm thick, which includes the thickness of the lower sidewall spacer layer 502 and the outer sidewall spacer 528

Figure 6:
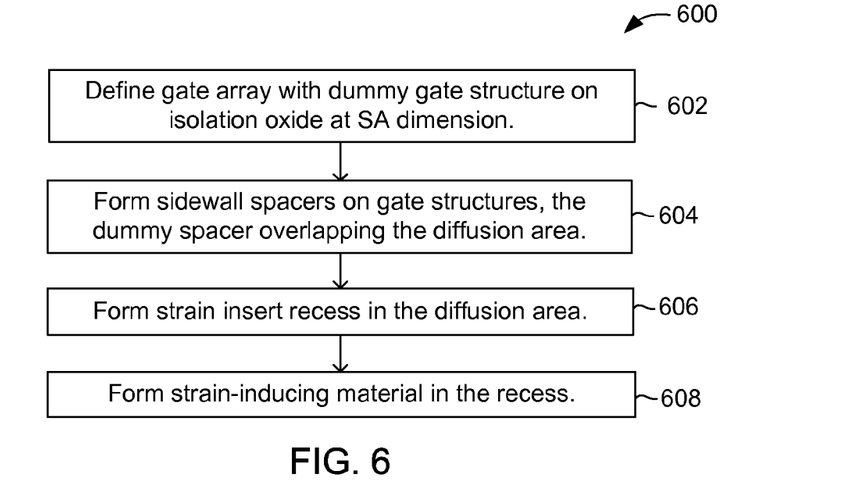
FIG. 6 is a flow chart of a method of fabricating an IC on a wafer according to an embodiment.

FIG. 6 is a flow chart of a method of fabricating an IC on a wafer 600 according to an embodiment. The IC includes a transistor array with an edging transistor. A plurality of gate structures having a common gate structure width are defined on a diffusion area of the IC, including a dummy gate structure defined on an isolation oxide structure of the wafer so that a lateral edge of the dummy gate structure is above a boundary between the diffusion area and the isolation oxide structure (step 602). Sidewall spacers are formed on the plurality of gate structures, the sidewall spacers on active gate structures being essentially the same as a sidewall spacer(s) formed on the dummy gate structure(s) so as to overlap a portion of the diffusion area (step 604). A recess is formed in the diffusion area extending essentially from the sidewall spacer formed on the dummy gate structure to a sidewall spacer formed on an active gate structure (step 606). Strain-inducing material is formed in the recess (step 608) so as to create strain in the channel region associated with the active gate structure. In one embodiment, the strain-inducing material induces compressive strain. In a particular embodiment, the strain-inducing material is epitaxially grown SiGe. In an alternative embodiment, the strain inducing material induces tensile strain.

Figure 7:
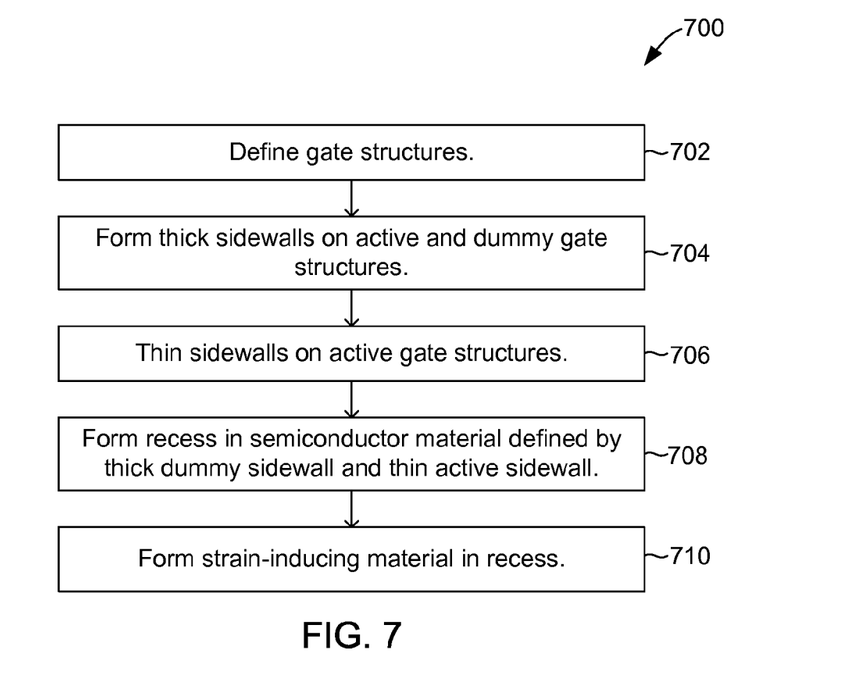
FIG. 7 is a flow chart of a method of fabricating an IC on a wafer according to another embodiment.

FIG. 7 is a flow chart of a method of fabricating an IC on a wafer 700 according to another embodiment. A plurality of gate structures having a common gate structure width are defined on the IC, including a dummy gate structure defined on an isolation oxide structure and an active gate structure defined over a channel region of an FET of the IC (step 702). Sidewalls are formed on the dummy gate structure and on the active gate structure having sufficient thickness so that the sidewall formed on the dummy gate structure overlaps a boundary between the isolation oxide structure and semiconductor of the wafer (step 704). In some embodiments, the sidewalls are formed from a single layer of sidewall material, such as silicon nitride. In alternative embodiments, two layers of sidewall material are formed, such as a layer of silicon oxide over a layer of silicon nitride. The sidewalls formed on the active gate structure(s) are thinned (step 706), while the sidewall overlapping the boundary between the isolation oxide and semiconductor is not thinned. In a particular embodiment using two sidewall spacer layers, an outer sidewall material is removed from the sidewall spacer of the active gate, and then an inner sidewall material is thinned to form sidewall spacers on the active gate that are thinner than the multi-layer sidewall spacer on the dummy gate. A recess is formed in the semiconductor material of the IC wafer extending essentially from the thick sidewall spacer formed on the dummy gate structure to the thin sidewall spacer formed on the active gate structure (step 708). In a particular embodiment, the thick (dummy) sidewall spacers are about 45 nm thick and the thin (active) sidewall spacers are about 30 nm thick. Strain-inducing material is formed in the recess (step 710) so as to create strain in the channel region associated with the active gate structure. In one embodiment, the strain-inducing material induces compressive strain. In a particular embodiment, the strain-inducing material is epitaxially grown SiGe. In an alternative embodiment, the strain inducing material induces tensile strain.

Figure 8:
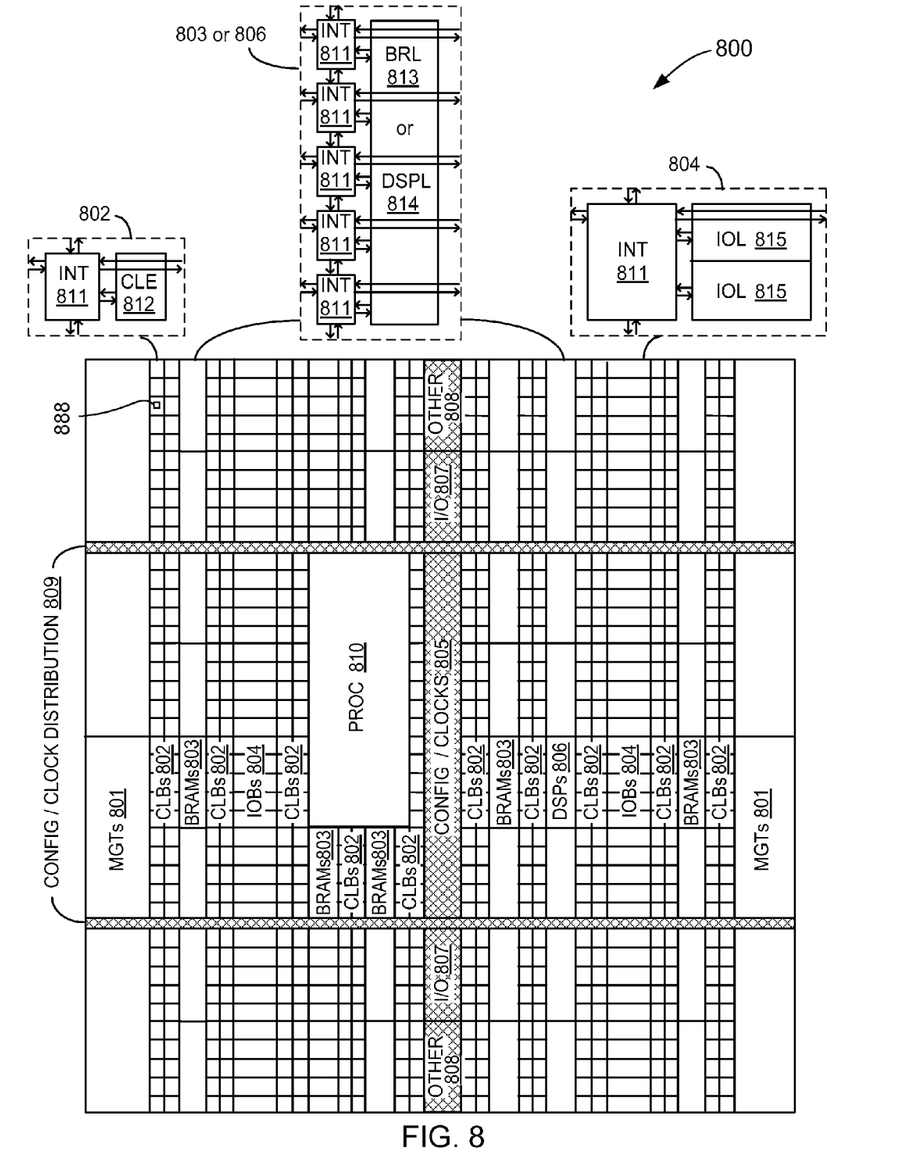
FIG. 8 is a plan view of an IC including transistors according to one or more embodiments.

FIG. 8 is a plan view of an IC 800 incorporating one or more embodiments. In a particular embodiment, the IC 800 is an FPGA fabricated using a 40 nm node technology that includes CMOS portions in several or all of the functional blocks, such as in RAM and logic, and is fabricated using a CMOS fabrication process. One or more transistors 888 include dummy gate structures according to one or more embodiments to improve carrier mobility in the transistor(s) using strain-inducing inserts formed in recesses of semiconductor material defined on one end by the dummy gate structures. In one embodiment, a dummy gate structure is placed on isolation oxide next to an the end of an edging transistor at the SA dimension, and sidewall spacers on the dummy gate structure is used to form a recess in semiconductor material of the IC for subsequent filling with strain-inducing material. In a particular embodiment, a dummy gate and associated structure is placed at the edge of a diffusion region of a plurality of FETs. In a more particular embodiment, the plurality of FETs implement a portion of an SRAM cell. In other embodiments, dummy gate structures are placed on isolation oxide and have a relatively thick sidewall spacer extending from the isolation oxide over a portion of semiconductor material, compared to the relatively thin sidewall spacer on an active gate structure. The thick and thin sidewall spacers on active and dummy gate structures provides a device designer with flexibility for independently optimizing the offsets.

The FPGA architecture includes a large number of different programmable tiles including multi-gigabit transceivers (MGTs 801), configurable logic blocks (CLBs 802), random access memory blocks (BRAMs 803), input/output blocks (IOBs 804), configuration and clocking logic (CONFIG/CLOCKS 805), digital signal processing blocks (DSPs 806), specialized input/output blocks (I/O 807) (e.g., configuration ports and clock ports), and other programmable logic 808 such as digital clock managers, analog-to-digital converters, system monitoring logic, and so forth. Some FPGAs also include dedicated processor blocks (PROC 810).

In some FPGAs, each programmable tile includes a programmable interconnect element (INT 811) having standardized connections to and from a corresponding interconnect element in each adjacent tile. Therefore, the programmable interconnect elements taken together implement the programmable interconnect structure for the illustrated FPGA. The programmable interconnect element (INT 811) also includes the connections to and from the programmable logic element within the same tile, as shown by the examples included at the top of FIG. 8.

For example, a CLB 802 can include a configurable logic element (CLE 812) that can be programmed to implement user logic plus a single programmable interconnect element (INT 811). A BRAM 803 can include a BRAM logic element (BRL 813) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 806 can include a DSP logic element (DSPL 814) in addition to an appropriate number of programmable interconnect elements. An IOB 804 can include, for example, two instances of an input/output logic element (IOL 815) in addition to one instance of the programmable interconnect element (INT 811). As will be clear to those of skill in the art, the actual I/O pads connected, for example, to the I/O logic element 815 are manufactured using metal layered above the various illustrated logic blocks, and typically are not confined to the area of the input/output logic element 815. In the pictured embodiment, a columnar area near the center of the die (shown shaded in FIG. 8) is used for configuration, clock, and other control logic.

Some FPGAs utilizing the architecture illustrated in FIG. 8 include additional logic blocks that disrupt the regular columnar structure making up a large part of the FPGA. The additional logic blocks can be programmable blocks and/or dedicated logic. For example, the processor block PROC 810 shown in FIG. 8 spans several columns of CLBs and BRAMs.

Note that FIG. 8 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 8 are purely exemplary. For example, in an actual FPGA more than one adjacent column of CLBs is typically included wherever the CLBs appear, to facilitate the efficient implementation of user logic.

While the present invention has been described in connection with specific embodiments, variations of these embodiments will be obvious to those of ordinary skill in the art. For example, other materials may be used for the sidewall spacer layers, or other processing sequences may be followed. Therefore, the spirit and scope of the appended claims should not be limited to the foregoing description.

What is claimed is:

1. An integrated circuit ("IC") comprising:
   a semiconductor substrate;
   an active gate structure having a gate structure width formed over a channel region in the semiconductor substrate;
   a first sidewall spacer disposed on a first sidewall of the active gate structure having a first sidewall spacer width;
   a dielectric isolation structure formed in the semiconductor substrate;
   a dummy gate structure having the gate structure width formed on the dielectric isolation structure;
   a second sidewall spacer disposed on a second sidewall of the dummy gate structure having a second sidewall spacer width;
   a strain-inducing insert formed in the semiconductor substrate extending from the first sidewall spacer to the second sidewall spacer; and
   a semiconductor portion between the strain-inducing insert and the dielectric isolation structure;
   wherein the second sidewall spacer overlaps a boundary between the semiconductor portion and the dielectric isolation structure.

2. The IC of claim 1 wherein the first sidewall spacer width is the same as the second sidewall spacer width.

3. The IC of claim 1 wherein the active gate structure has a third sidewall spacer disposed on an opposite sidewall of the active gate structure, the active gate structure being a gate structure for an edging field-effect transistor formed over a diffusion area, and further comprising
   a second active gate structure formed over the diffusion area having a fourth sidewall spacer; and
   a second strain-inducing insert formed in the semiconductor substrate extending from the fourth sidewall spacer to the third sidewall spacer.

4. The IC of claim 1 wherein the active gate structure is formed on a diffusion area of the semiconductor substrate, a design dimension extending from the first sidewall of the active gate structure to a distal edge of the diffusion area, the second sidewall being selectively spaced from the first sidewall by the design dimension.

5. The IC of claim 1 wherein the strain-inducing insert provides tensile strain in the channel region.

6. The IC of claim 1 wherein the strain-inducing insert provides compressive strain in the channel region.

7. The IC of claim 1 wherein the semiconductor substrate is a silicon substrate and the strain-inducing insert comprises SiGe epitaxially grown in a recess formed in the silicon substrate.

8. The IC of claim 1 wherein the semiconductor substrate is a silicon substrate and the strain-inducing insert comprises SiC epitaxially grown in a recess formed in the silicon substrate.

9. The IC of claim 1 wherein the first sidewall spacer width is less than the second sidewall spacer width.

10. The IC of claim 9 wherein the second sidewall spacer extends over a portion of the dielectric isolation structure and the semiconductor portion.

11. The IC of claim 9 wherein the second sidewall spacer is formed from a sidewall spacer layer and the first sidewall spacer is formed from the sidewall spacer layer.

12. The IC of claim 9 wherein the second sidewall spacer comprises an outer sidewall portion formed from an outer sidewall spacer layer and an inner sidewall spacer layer disposed between the outer sidewall portion and the dummy gate and between the outer sidewall portion and the dielectric isolation structure and the semiconductor portion, and the first sidewall spacer layer is formed from the inner sidewall spacer layer.

13. The IC of claim 1 wherein a width of the dielectric isolation structure is greater than the gate structure width.

* * * * *